(12) United States Patent
Kurata

(10) Patent No.: US 10,051,769 B2
(45) Date of Patent: Aug. 14, 2018

(54) MAINTENANCE SUPPORT SYSTEM AND MAINTENANCE SUPPORT METHOD IN ELECTRONIC COMPONENT MOUNTING SYSTEM

(71) Applicant: Panasonic Intellectual Property Management Co., Ltd., Osaka (JP)

(72) Inventor: Hiroaki Kurata, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 168 days.

(21) Appl. No.: 15/267,077

(22) Filed: Sep. 15, 2016

(65) Prior Publication Data

US 2017/0099752 A1 Apr. 6, 2017

(30) Foreign Application Priority Data

Oct. 5, 2015 (JP) ................................. 2015-197270

(51) Int. Cl.
*B23P 19/00* (2006.01)
*H05K 13/04* (2006.01)
*H05K 13/08* (2006.01)

(52) U.S. Cl.
CPC .............. *H05K 13/04* (2013.01); *H05K 13/08* (2013.01); *Y10T 29/4913* (2015.01); *Y10T 29/53174* (2015.01)

(58) Field of Classification Search
CPC ........ H05K 13/08; H05K 13/02; H05K 13/04; G05B 19/418; Y10T 29/53174; Y10T 29/4913
USPC ... 29/739, 428, 592.1, 564.1, 705, 740, 829, 29/832, 836
See application file for complete search history.

(56) References Cited

U.S. PATENT DOCUMENTS 7,142,939 B2 * 11/2006 Nonaka ............ G05B 19/41805
700/121
9,936,619 B2 * 4/2018 Nozawa ............. H05K 13/0417

FOREIGN PATENT DOCUMENTS

JP 2010-098213 4/2010

* cited by examiner

*Primary Examiner* — Thiem Phan
(74) *Attorney, Agent, or Firm* — Pearne & Gordon LLP

(57) ABSTRACT

Provided is an electronic component mounting system that includes an electronic component mounting line that includes multiple electronic component mounters to which identification marks, respectively, are affixed, a management computer, and a portable terminal that has a recognition unit that recognizes the identification mark. In the management computer, a maintenance operation plan is created, a maintenance instruction in which the maintenance operation plan and the identification mark are associated with each other is issued, each of the multiple maintenance instructions and maintenance information that is associated with each of the multiple maintenance instructions are stored, one of the multiple maintenance instructions and maintenance information that is associated with the one maintenance instruction are transmitted to the portable terminal.

12 Claims, 6 Drawing Sheets

FIG. 2
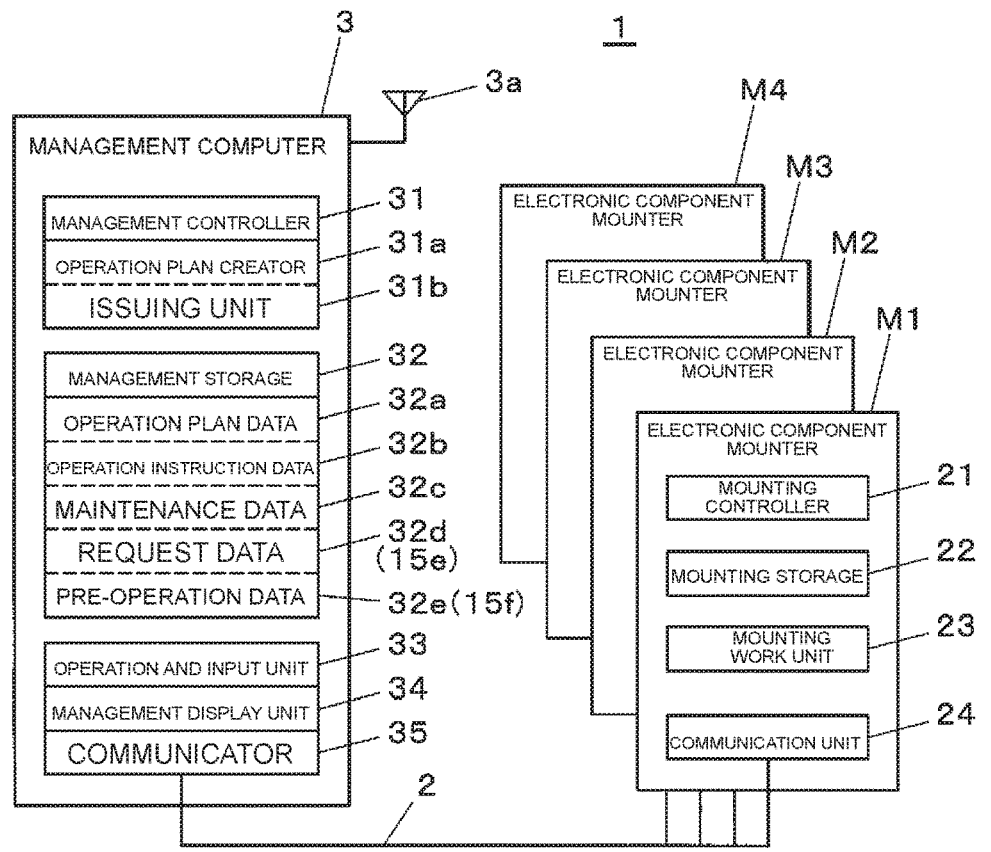
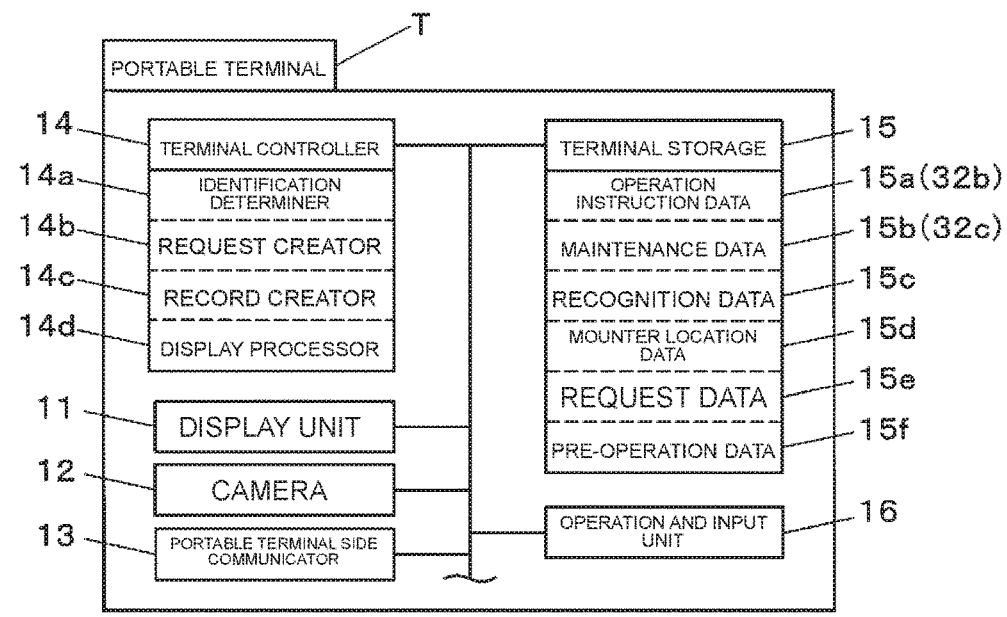

MAINTENANCE SUPPORT SYSTEM AND MAINTENANCE SUPPORT METHOD IN ELECTRONIC COMPONENT MOUNTING SYSTEM

BACKGROUND

1. Technical Field

The present disclosure relates to a maintenance support system and a maintenance support method in an electronic component mounting system that mounts an electronic component onto a board.

2. Description of the Related Art

An electronic component mounting line has a constitution in which multiple electronic component mounters are connected to one another. In the electronic component mounting line, an electronic component is mounted onto the board and a mounting board is manufactured. An electronic component mounter is constituted from a board transport mechanism that transports and positions a board, a tape feeder that supplies an electronic component, a mounting head that suction-retains the electronic component using a suction nozzle, and a drive mechanism, such as a head moving mechanism, which moves the mounting head in the horizontal direction. In the electronic component mounter, in order to normally operate these drive mechanisms, a person in charge of maintenance performs a maintenance operation periodically or when a malfunction occurs.

A maintenance support system that supports in such a manner that an operation of maintaining an electronic component mounter in the related art is quickly performed is proposed (For example, Japanese Patent Unexamined Publication No. 2010-98213 (PTL 1)). In the maintenance support system that is disclosed in PTL 1, it is detected that, among maintenance target parts of the electronic component mounter, a maintenance target part that needs maintenance because now is the time to periodically perform the maintenance or that becomes in a state where the maintenance has to be performed is present, and maintenance support information that indicates a result of specifying the detected maintenance target part is displayed on a display unit that is included in the electronic component mounter.

SUMMARY

An object of the present disclosure is to provide a maintenance support system and a maintenance support method in an electronic component mounting system that can improve efficiency in an operation of maintaining the electronic component mounting system by a person in charge of maintenance.

A maintenance support system in an electronic component mounting system according to the present invention includes an electronic component mounting line, a management apparatus, and a portable terminal. The electronic component line includes multiple electronic component mounters to which identification marks, respectively, are affixed. The management apparatus manages the electronic component mounting line. The portable terminal includes a display unit, a recognition unit that recognizes the identification marks, and a portable terminal side communication unit that communicates with the management apparatus. The management apparatus includes an operation plan creator that creates a maintenance operation plan for each of the multiple electronic component mounters, an issuing unit that issues multiple maintenance instructions in which each of the maintenance operation plans that are created by the operation plan creator is associated with a different one of the identification marks of the multiple electronic component mounters, a storage in which the multiple maintenance instructions that are issued by the issuing unit and maintenance information that are associated with the multiple maintenance instructions on each of the multiple electronic component mounters, respectively, are stored, and a management apparatus side communication unit that communicates with the portable terminal. The management apparatus transmits one of the multiple maintenance instructions that are issued by the issuing unit to the portable terminal, and transmits maintenance information that is associated with the transmitted one of the multiple maintenance instructions to the portable terminal. When an identification mark affixed to any one of the multiple electronic component mounters that is recognized by the recognition unit is consistent with an identification mark that is associated with the received one of the multiple maintenance instructions, the portable terminal displays maintenance information on the electronic component mounter that corresponds to the two identification marks which are consistent with each other, among the multiple electronic component mounters, on the display unit.

A maintenance support method in an electronic component mounting system according to the present invention is a maintenance support method in an electronic component mounting system that includes an electronic component mounting line that includes multiple electronic component mounters to which identification marks, respectively are affixed, a management apparatus that manages the electronic component mounting line, and a portable terminal that has a display unit, a recognition unit that recognizes the identification marks, and a portable terminal side communication unit that communicates with the management apparatus. The management apparatus includes a management apparatus side communication that communicates with the portable terminal. The maintenance support method in the electronic component system creates a maintenance operation plan for each of the multiple electronic component mounters. Next, multiple maintenance instructions are issued in which each of the maintenance operation plans that are created is associated with a different one of the identification marks of the multiple electronic component mounters. Next, the multiple maintenance instructions that are issued and maintenance information on each of the multiple electronic component mounters that are associated with the multiple maintenance instructions, respectively are stored in a storage. Next, one of the multiple maintenance instructions that are issued is transmitted to the portable terminal, and transmitting maintenance information that is associated with the transmitted one of the multiple maintenance instructions is transmitted to the portable terminal. Next, the portable terminal receives the transmitted maintenance instruction. Next, the recognition unit acquires recognition information that includes an identification mark that is affixed to any one of the multiple electronic component mounters, through recognition. Next, it is determined whether or not the identification mark that results from the recognition, and an identification mark that is associated with the received maintenance instruction are consistent with other. Next, in a case where it is determined that the recognized identification mark and the identification mark that is associated with the received maintenance instruction are consistent with each other, the maintenance information on the electronic component mounter that corresponds to the two identification marks which are consistent with each other, among the multiple electronic component mounters, is displayed on the display unit.

According to the present disclosure, efficiency in an operation of maintaining an electronic component mounting system by a person in charge of maintenance can be improved.

BRIEF DESCRIPTION OF THE DRAWINGS

FIG. 2 is a block diagram illustrating a constitution of a control system of the electronic component mounting system according to one exemplary embodiment of the present disclosure;

DETAILED DESCRIPTION

Problems with systems in the related art will be briefly described below before providing descriptions of exemplary embodiments of the present disclosure. However, in the related art including PTL 1, the maintenance target part is broadcast on a display unit that is included in each electronic component mounter and thus the following problem occurs. That is, in the electronic component mounting line that has the constitution in which multiple electronic component mounters are connected to one another, when taking a look at the display unit of the electronic component mounter, an operator in charge of a mounting operation, such as component supply, for the first time, comes to be aware that the electronic component mounter needs maintenance. Normally, because the operator cannot perform the maintenance of the mounter, the operator gets in touch with a person in charge of maintenance who has received high-level professional education and has a maintenance operation skill in order to perform the maintenance.

For this reason, in a case where one operator is in charge of multiple electronic component mounters, because it is noticed with a delay that the maintenance is necessary or a necessary maintenance component and the like are delivered to a storage area after the person in charge of maintenance checks a situation of the mounter, there is a problem in that it takes time to complete the maintenance.

Figure 1:
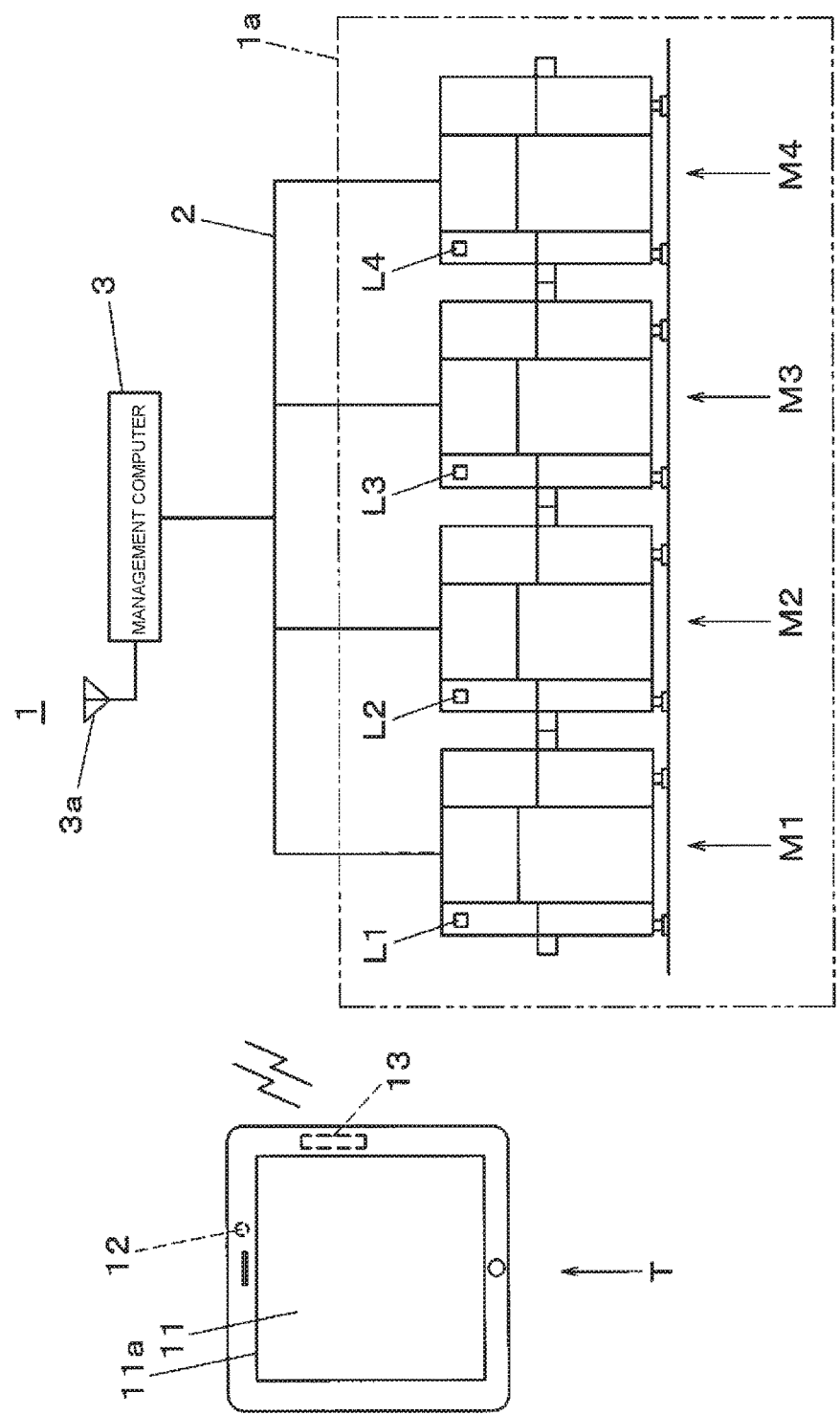
FIG. 1 is a diagram for describing a constitution of an electronic component mounting system according one exemplary embodiment of the present disclosure.

Next, one exemplary embodiment of the present invention is described referring to the drawings. First, a constitution of electronic component mounting system 1 is described referring to FIG. 1. Electronic component mounting system 1 has a function of mounting an electronic component onto a board and thus manufacturing a mounting board. Electronic component mounting system 1 includes electronic component mounting line 1a to which multiple electronic component mounters M1 to M4 are connected, management computer 3 that has overall control of the mounters in electronic component mounting system 1, communication network 2 that connects these, and portable terminal T that wirelessly communicates with management computer 3. Management computer 3 is a management apparatus that manages electronic component mounting line 1a, and has management apparatus side communication unit 3a that wirelessly communicates with portable terminal T.

Electronic component mounters M1 to M4 mounts an electronic component onto aboard on which solder for joining components is printed, using a solder printing apparatus (whose illustration is omitted). Identification marks L1 to L4, such as two-dimensional codes for specifying mounters, are affixed to electronic component mounters M1 to M4, respectively. That is, electronic component mounting line 1a includes multiple electronic component mounters M1 to M4 to which identification marks L1 to L4 are affixed, respectively. Electronic component mounters M1 to M4 each have a board transport mechanism that transports the board, and a board transport path is formed by connecting these in series. In electronic component mounting line 1a, an electronic component mounting operation is performed on the board that is transported along the board transport path.

The board that goes through the electronic component mounting operation is heated by a reflow apparatus (whose illustration is omitted) according to a heating profile, and thus solder is melted and solidified, thereby solder-joining the electronic component being solder-joined to the board. Electronic component mounting system 1 may include multiple electronic component mounting lines 1a, depending on how many of the mounting boards are to be manufactured. Furthermore, a constitution of electronic component mounting line 1a is also not limited to an example in FIG. 1. Electronic component mounting line 1a may be constituted to include one of electronic component mounters M1 to M4, and may be constituted to further include a solder printing apparatus and a reflow apparatus.

Portable terminal T has display unit 11, camera 12 that images identification marks L1 to L4 that are affixed to electronic component mounters M1 to M4 and thus recognizes identification marks L1 to L4, and portable terminal side communication unit 13 that wirelessly communicates with management computer 3 (management apparatus). That is, camera 12 is a recognition unit that recognizes identification marks L1 to L4 by capturing the images thereof. Identification marks L1 to L4 are not limited to two-dimensional codes. Identification marks L1 to L4 may be RFIDs, such as RF tags, into each of which ID information, although being one-dimensional codes such as bar codes, is embedded. In a case where identification marks L1 to L4 is RFIDs, the recognition unit is an RF communication unit that communicates with a RFID, and identification marks L1 to L4 are recognized from a reception signal. Furthermore, each of identification marks L1 to L4 may be recognized with a network number (for example, a physical address and the like of a network device that is included in each mounter) that is identifiable in the same manner.

Various operation screens, various pieces of information that are transmitted from management computer 3, images that are captured by camera 12, and the like are displayed on display screen 11a of display unit 11. A lens of camera 12 is provided in such a manner that the lens of camera 12 is positioned in an opening in the rear surface of a main body of portable terminal T, with display screen 11a on the front surface thereof. Accordingly, camera 12 can face in the direction in which camera 12 wants to capture an image while an image that is captured by camera 12 is being displayed on display screen 11a.

Next, a control system of electronic component mounting system 1 is described referring to FIG. 2. Electronic component mounters M1 to M4 have the same constitution. At this point, electronic component mounter M1 is described. Electronic component mounter M1 includes mounting controller 21, mounting storage 22, mounting work unit 23, and communication unit 24. Electronic component mounting data that include a mounting operation parameter necessary for mounting controller 21 to control mounting work unit 23 is stored in mounting storage 22.

Mounting work unit 23 is constituted from a board transport mechanism that transports and positions a board, a tape feeder that supplies an electronic component, a mounting head that suction-retains the electronic component using a suction nozzle, a drive mechanism, such as a head moving mechanism, which moves the mounting head in the horizontal direction, a touch panel on which display of various pieces of information and input of an operation command or data is performed, and the like. The mounting controller 21 controls mounting work unit 23 based on the electronic component mounting data, and thus performs the electronic component mounting operation of mounting the electronic component onto the board that is carried into electronic component mounter M1. Communication unit 24 is a communication interface, and performs transmission and reception of a signal between electronic component mounter M1 and management computer 3 through communication network 2.

In FIG. 2, management computer 3 includes management controller 31, management storage 32, operation and input unit 33, management display unit 34, communication unit 35, and management apparatus side communication unit 3a. Management controller 31 is an arithmetic operator, such as a CPU, and has an internal processor, such as an operation plan creator 31a and issuing unit 31b. Management storage 32 is a storage device. In addition to the electronic component mounting data for perform overall control of electronic component mounting system 1, operation plan data 32a, operation instruction data 32b, maintenance data 32c, request data 32d, pre-operation data 32e, and the like are stored in the management storage 32.

Request data 32d is data relating to maintenance request R that includes imaged data on a part of electronic component mounters M1 to M4 that needs maintenance, which is created and transmitted in portable terminal T and is stored in management storage 32. The operation plan creator 31a creates maintenance operation plan S for each of electronic component mounters M1 to M4 based on maintenance request R of request data 32d, and stores created maintenance operation plan S, as operation plan data 32a, in management storage 32. Issuing unit 31b issues (creates) maintenance instruction D in which maintenance operation plan S created by operation plan creator 31a and identification marks L1 to L4 of electronic component mounters M1 to M4, respectively, are associated with each other, and stores issued maintenance instruction D, as operation instruction data 32b, in management storage 32.

Maintenance data 32c is data relating to maintenance information I that includes past records of electronic component mounters M1 to M4 that are associated with maintenance instruction D issued by issuing unit 31b and maintenance instruction D created by operation plan creator 31a, and the like. Pre-operation data 32e is data that includes pre-operation record N in which a pre-operation state of a maintenance target part of electronic component mounters M1 to M4 associated with maintenance instruction D is stored, which is created and transmitted in portable terminal T and is stored in management storage 32. An imaged data on the maintenance target part is included in pre-operation record N.

Operation and input unit 33 is an input device, such as a keyboard, a touch panel, or a mouse, and is used when inputting an operation command or data. Management display unit 34 is a display device, such as a liquid crystal panel. Various screens, such as a guidance screen when an operation is performed with operation and input unit 33, or a screen for creating a maintenance operation plan, are displayed on management display unit 34. Communication unit 35 is a communication interface, and performs transmission and reception of a signal between each of electronic component mounters M1 to M4 in electronic component mounting line 1a through communication network 2.

In FIG. 2, portable terminal T includes terminal controller 14, terminal storage 15, display unit 11, camera 12, portable terminal side communication unit 13, and operation and input unit 16. Terminal controller 14 is an arithmetic operation device, such as a CPU, and has an internal processor, such as identification determiner 14a, request creator 14b, record creator 14c, and display processor 14d. Terminal storage 15 is a storage device. Operation instruction data 15a, maintenance data 15b, recognition data 15c, mounter location data 15d, request data 15e, pre-operation data 15f and the like are stored in terminal storage 15. Operation and input unit 16 is an input device, such as an operation button or a touch panel, and is used when inputting an operation command or data.

Operation instruction data 15a is data that includes maintenance instructions D and maintenance information that is associated with each of maintenance instructions D because operation instruction data 32b created by management computer 3 is transmitted and then is stored in terminal storage 15. Maintenance data 15b is data that includes maintenance information I because maintenance data 32c created by management computer 3 is transmitted and then is stored in terminal storage 15. Recognition data 15c is recognition information that is stored in terminal storage 15, which is imaged data on recognition range A that results from imaging and recognition by camera 12 and is recognized. Mounter location data 15d is data that includes location information C indicating locations of electronic component mounters M1 to M4, which are associated with maintenance instruction D, in electronic component mounting line 1a.

Identification determiner 14a performs recognition processing on pieces of imaged data on identification marks L1 to L4 that are affixed to electronic component mounters M1 to M4, respectively which are imaged by camera 12, and thus determines whether identification marks L1 to L4 that results from the recognition and identification marks L1 to L4 that are associated with maintenance instruction D, respectively are consistent with each other.

Request creator 14b creates maintenance request R in which recognition data 15c (recognition information) is associated with information on each of the electronic component mounters that are specified by identification marks L1 to L2 which are affixed to electronic component mounters M1 to M4, respectively. Recognition data 15c (recognition information) that results from camera 12 (recognition unit) imaging and recognizing the part of electronic component mounters M1 to M4, which needs the maintenance, in such a manner that the part falls within recognition range A is stored in terminal storage 15. Furthermore, request creator 14b stores created maintenance request R, as request data 15e, in terminal storage 15, and transmits created maintenance request R to management computer 3.

Record creation unit 14c creates pre-operation record N in which recognition data 15c (recognition information) is associated with maintenance instruction D. When performing the maintenance operation, recognition data 15c (recognition information) that results from camera 12 (recognition unit) imaging and recognizing electronic component mounters M1 to M4 in such a manner that a specific mark P that is affixed to specify the part that is the target for the maintenance falls within recognition range A is stored in terminal storage 15. Furthermore, record creator 14c stores created pre-operation record N, as pre-operation data 15f, in terminal storage 15, and transmits created pre-operation record N to management computer 3.

Based on various pieces of data that are stored in terminal storage 15, display processor 14d performs display processing that creates various pieces of display screen data for display on display unit 11. For example, display processor 14d displays maintenance information I on electronic component mounters M1 to M4 that are specified by identification marks L1 to L4, respectively, which is included in maintenance data 15b, on display unit 11. Furthermore, display processor 14d displays recognition data 15c and maintenance information I on electronic component mounters M1 to M4 that are specified by identification marks L1 to L4, respectively, which are included in maintenance data 15b, on display unit 11 in a manner that superimposes recognition data 15c and maintenance information I onto each other.

Furthermore, display processor 14d displays recognition data 15c and location information C on electronic component mounters M1 to M4 that are specified by identification marks L1 to L4, respectively, which are included in mounter location data 15d, on display unit 11 in a manner that superimposes recognition data 15c and location information C onto each other. Furthermore, display processor 14d displays recognition data 15c in which the part of electronic component mounters M1 to M4 that are specified by identification marks L1 to L4, respectively which is the target for the maintenance, falls within recognition range A, and information indicating a part that is a target for maintenance, on display unit 11, in a manner that superimposes recognition data 15c and the information on the part onto each other.

Figure 3:
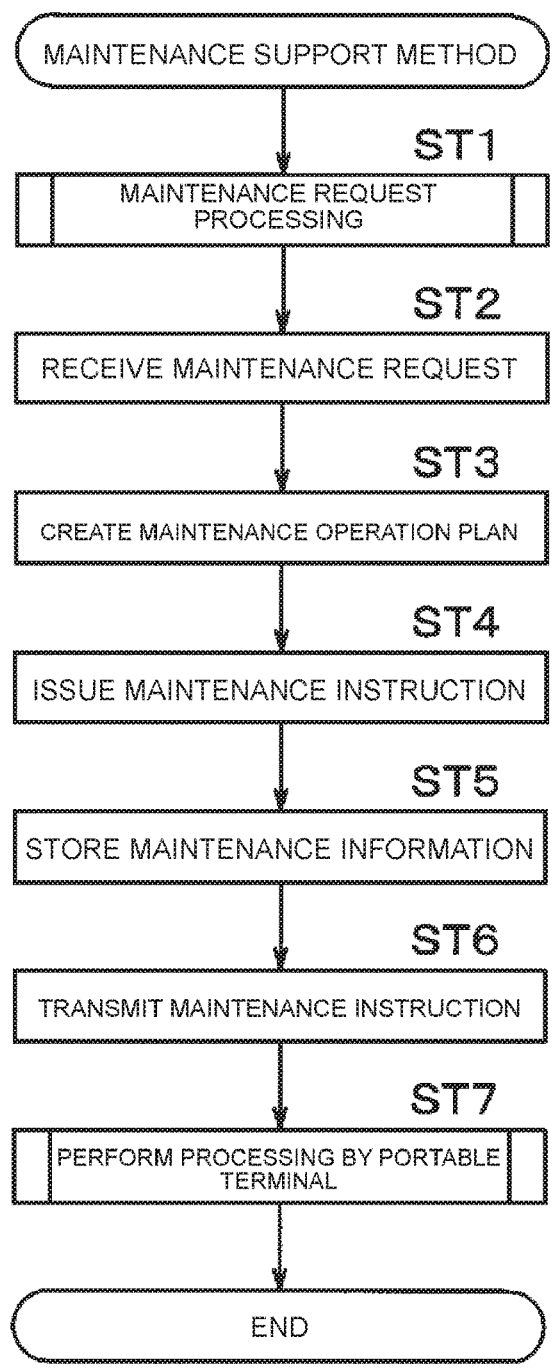
FIG. 3 is a flowchart of a maintenance support method in the electronic component mounting system according to one exemplary embodiment of the present disclosure.
Figure 4:
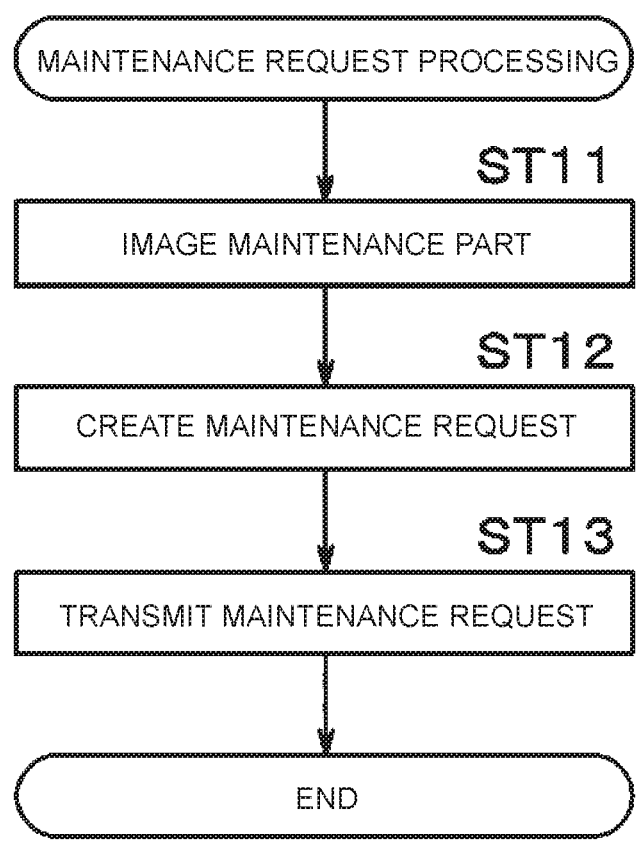
FIG. 4 is a flowchart of maintenance request processing in the electronic component mounting system according to one exemplary embodiment of the present disclosure.
Figure 5:
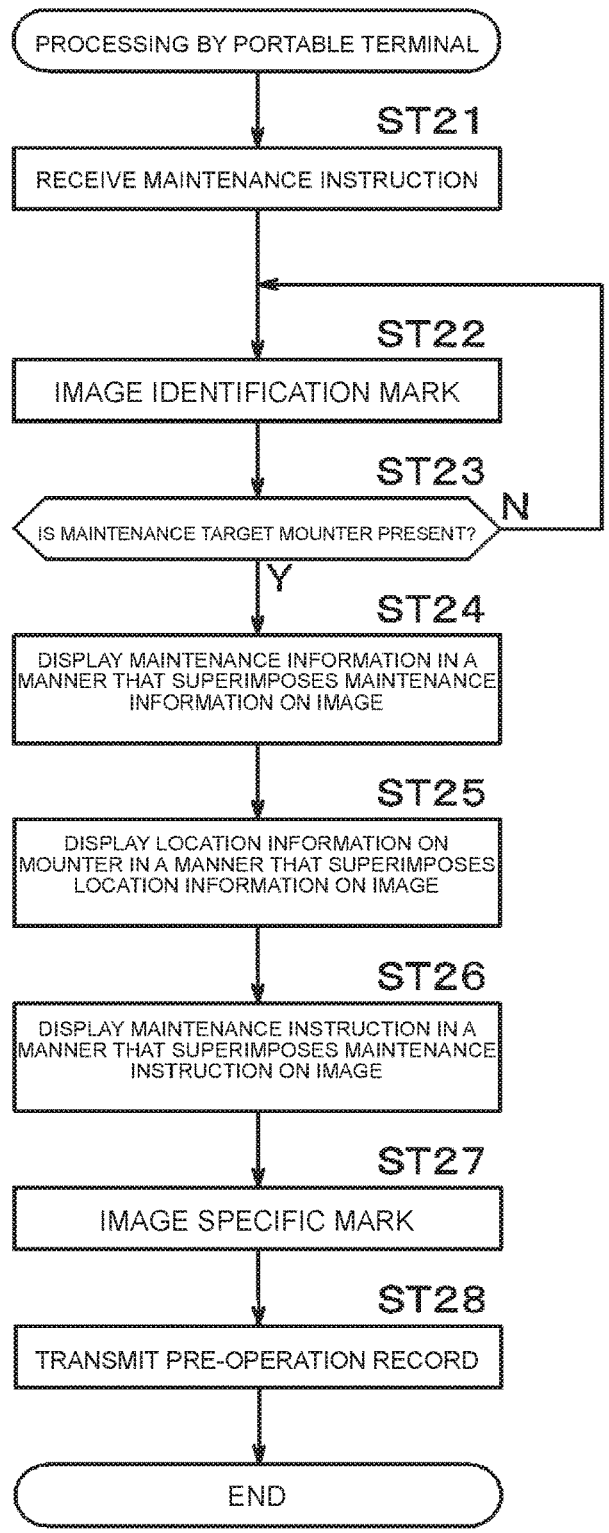
FIG. 5 is a flowchart of processing by a portable terminal in the electronic component mounting system according to one exemplary embodiment of the present disclosure.
Figure 6:
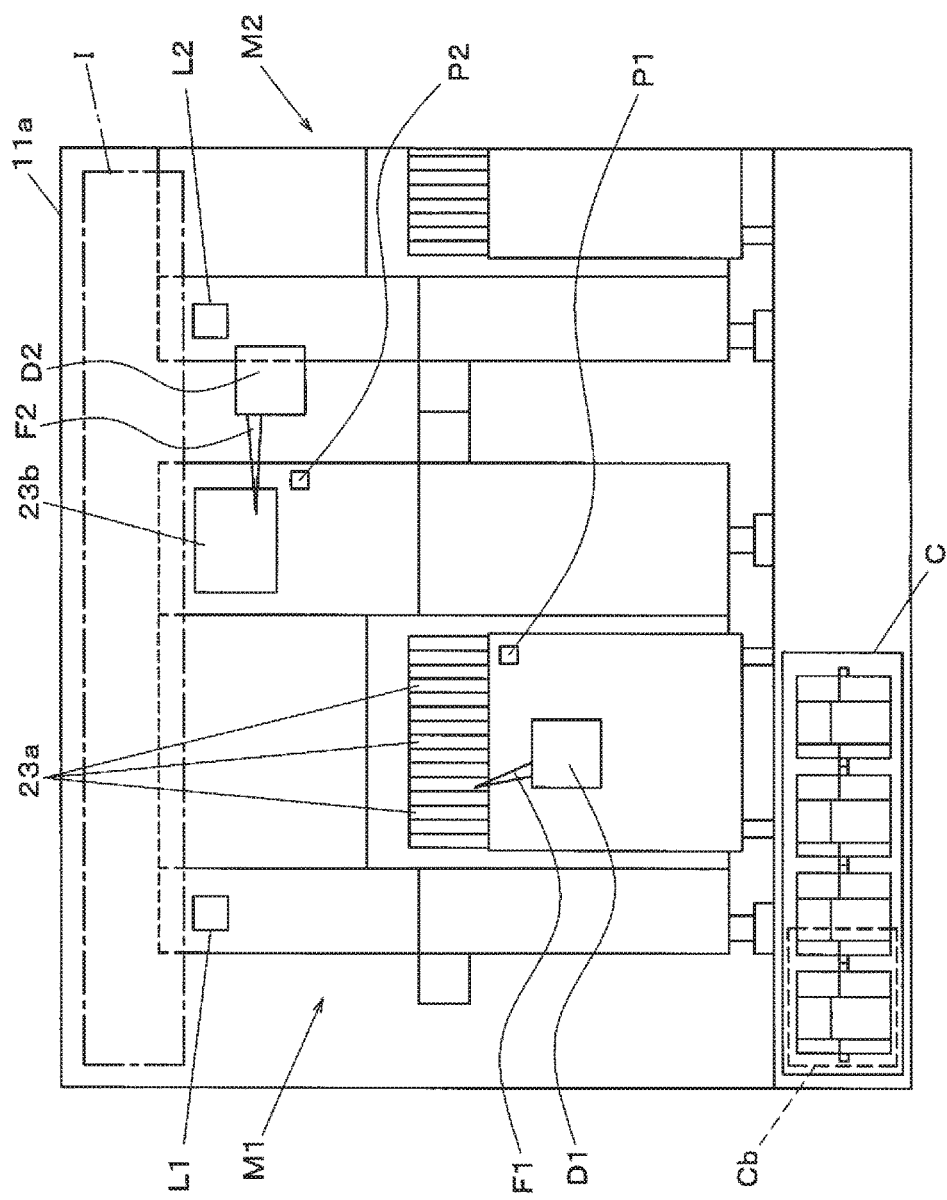
FIG. 6 is a diagram illustrating an example of display on a display screen of the portable terminal that is included in the electronic component mounting system according to one exemplary embodiment of the present disclosure.

Next, a maintenance support method in electronic component mounting system 1 that supports the maintenance operation of electronic component mounters M1 to M4 which constitute electronic component mounting line 1a is described in line with flows in FIGS. 3 to 5, referring to FIG. 6. In electronic component mounters M1 to M4, when a situation where the maintenance operation is necessary occurs, such as when trouble or breakage occurs in mounting work unit 23, an operator in charge of the electronic component mounting operation of electronic component mounters M1 to M4 operates portable terminal T to perform maintenance request processing (ST1: maintenance request process).

At this point, the maintenance request processing is described in detail referring to FIG. 4. First, the operator performs image capturing using camera 12 (recognition unit) in such a manner that the part of electronic component mounters M1 to M4, which needs the maintenance, falls within recognition range A. Accordingly, imaged data is stored as recognition data 15c (ST11). Subsequently request creator 14b creates recognition data 15c (recognition information) as maintenance request R in a state of being associated with pieces of information on electronic component mounters M1 to M4 that are specified with identification marks L1 to L4 that are affixed to electronic component mounters M1 to M4, respectively and stores created recognition data 15c in request data 15e (ST12). At this time, by operating operation and input unit 16 of portable terminal T, the operator stores information, such as the reason that the maintenance is necessary or a situation where the maintenance is necessary, in request data 15e.

Subsequently, request creator 14b transmits request data 15e, which is stored in terminal storage 15, to management computer 3 (ST13). In FIG. 3, management computer 3 receives transmitted request data 15e, and stores received request data 15e, as request data 32d, in management storage 32 (ST2). That is, ST13 and ST2 are steps in which created maintenance request R is stored in management storage 32 (storage).

Subsequently based on maintenance request R of request data 32d, operation plan creator 31a creates maintenance operation plan S for each of electronic component mounters M1 to M4 (ST3: an operation plan creation step). Created maintenance operation plan S is stored as operation plan data 32a in management storage 32. At this time, a person in charge of overall control of the maintenance operation performs an operation of making maintenance operation plan S while referring to imaged data on the part that needs the maintenance, which is included in maintenance request R, and the like.

Subsequently issuing unit 31b issues maintenance instruction D in which maintenance operation plan S created in the operation plan creation step (ST3) and identification marks L1 to L4 of electronic component mounters M1 to M4 are associated with each other (ST 4: an issue step). Issued maintenance instruction D is stored, as operation instruction data 32b, in management storage 32. Subsequently maintenance instruction D issued in the issue step (ST4) and maintenance information I on electronic component mounters M1 to M4, which is associated with maintenance instruction D are stored, as maintenance data 32c, in management storage 32 (storage) (ST5).

Subsequently, the operation instruction data 32b is transmitted to portable terminal T of a person in charge of maintenance who performs the maintenance operation (ST6). That is, (ST6) is a step in which maintenance instruction D that is issued in the issue step (ST4) is transmitted to portable terminal T. Subsequently in portable terminal T, portable terminal processing is performed (ST7). Based on a skill that the person in charge of maintenance has, details of the maintenance operation, a job schedule for the person in charge of maintenance, and the like, a manager in charge of making maintenance operation plan S assigns the maintenance operation to the person in charge of maintenance. Furthermore, the skill that is required of the person in charge of maintenance who is assigned the maintenance operation, the job schedule, and the like may be stored in management computer 3, and management computer 3 may perform assignment of the maintenance operation.

Next, the portable terminal processing is described in detail referring to FIG. 5. Portable terminal T receives transmitted operation instruction data 32b, and stores received operation instruction data 32b, as operation instruction data 15a, in terminal storage 15 (ST21). That is, ST21 is a step in which portable terminal T receives transmitted maintenance instruction D. Subsequently, the person in charge of maintenance performs the image capturing using camera 12 (recognition unit) in such a manner that identification marks L1 to L4 which are affixed to electronic component mounters M1 to M4, respectively, fall within recognition range A, and recognizes identification marks L1 to L4 that are affixed to electronic component mounters M1 to M4, respectively (ST22: a recognition step).

When the person in charge of maintenance searches for electronic component mounters M1 to M4 that are targets for maintenance and performs the imaging, locations of electronic component mounters M1 to M4 within a floor in which electronic component mounting line 1a is installed may be on display screen 11a of portable terminal T for support of the operation. For example, the locations of electronic component mounters M1 to M4 may be indicated on a floor map, or a current location may be displayed by specifying the location of portable terminal T from a state where a wireless communication signal is received from portable terminal T. Alternatively, electronic component mounters M1 to M4 that are near portable terminal T whose location is specified are enumerated on display screen 11a.

Subsequently, identification determiner 14a determines whether or not identification marks L1 to L4 that results from the recognition and identification marks L1 to L4 that are associated with received maintenance instruction D, respectively, are consistent with each other (ST 23: a determination step). In the determination step (ST 23), in a case where it is determined that two different sets of identifications L1 to L4 are not consistent (No), the recognition step (ST22) and the determination step (ST23) are repeated until identification marks L1 to L4 that are consistent are imaged.

In the determination step (ST23), in a case where it is determined that two different sets of identification marks L1 to L4 are consistent (Yes), that is, indicated electronic component mounters M1 to M4 are imaged, display processor 14d displays recognition data 15c (recognition information) that results from the recognition by camera 12 (recognition unit) and is stored and maintenance information I on electronic component mounters M1 to M4 on display screen 11a of display unit 11 in a manner that superimposes recognition data 15c and maintenance information I onto each other (ST24). Furthermore, instead of displaying recognition data 15c and maintenance information I in a manner that superimposes recognition data 15c and maintenance information I onto each other, display processor 14d switches a display page and displays maintenance information I on electronic component mounters M1 to M4 on display screen 11a of display unit 11.

FIG. 6 illustrates one example of a screen that is displayed on display screen 11a of portable terminal T. In this example, it is assumed that electronic component mounter M1 in electronic component mounting line 1a is indicated as a target for maintenance. Displayed on display screen 11a is one portion of electronic component mounter M2 that is adjacent to electronic component mounter M1, which is imaged by camera 12 that is included in portable terminal T.

Because identification mark L1 falls within recognition range A, it is determined by identification determiner 14a that consistence with identification mark L1 which is associated with maintenance instruction D takes place. For this reason, maintenance information I is displayed on an upper part of display screen 11a in such a manner that maintenance information I is superimposed on imaged data of camera 12. In this manner, in a case where electronic component mounter M1 that is indicated with maintenance instruction D is displayed on display screen 11a, because maintenance information I is displayed, the person in charge of maintenance can acquire maintenance information I without erroneously determining a target for maintenance and without performing an additional operation.

In a case where RFIDs are used as identification marks L1 to L4, pieces of imaged data on electronic component mounters M1 to M4 that are imaged in advance are stored in recognition data 15c. When it is determined by identification determiner 14a that consistence of identification mark L1 takes place, display processor 14d displays maintenance information I on display screen 11a in a manner that superimposes maintenance information I onto the stored imaged data on electronic component mounter M1.

In FIG. 5, in the determination step (ST23), in the case where it is determined that two different sets of identification marks L1 to L4 are consistent (Yes), display processor 14d displays recognition data 15c (recognition information) that results from the recognition camera 12 (recognition unit) and is stored and location information C on electronic component mounters M1 to M4 on display screen 11a of display unit 11 in a manner that superimposes recognition data 15c and location information C onto each other (ST 25). In FIG. 6, location information C is displayed on a left lower side of display screen 11a in such a manner that location information C is superimposed on imaged data of camera 12. In this example, location information C in which a location that is equivalent to display screen 11a is indicated with dashed-line enclosure Cb is displayed in illustrations of electronic component mounters M1 to M4 that constitute electronic component mounting line 1a. Thus, the person in charge of maintenance can easily check for a location of a mounter that is a target for maintenance.

In FIG. 5, in the recognition step (ST22), camera 12 (recognition unit) recognizes electronic component mounters M1 to M4 in such a manner that identification marks L1 to L4 which are affixed to electronic component mounters M1 to M4, respectively, and a part that is a target for maintenance fall within recognition range A. In this state, in the determination step (ST23), in the case where it is determined that two different sets of identification marks L1 to L4 are consistent (Yes), display processor 14d displays recognition data 15c (recognition information) that results from the recognition by camera 12 (recognition unit) and is stored and the information indicating the part that is a target for maintenance, on display screen 11a of display unit 11 in a manner that superimposes recognition data 15c and the information indication the part onto each other (ST26).

In FIG. 6, it is assumed that tape feeder 23a that supplies an electronic component to mounting work unit 23 of electronic component mounting apparatus M1, and touch panel 23b on which information display and input are performed are parts that are targets for maintenance. In this case, blow-off signs F1 and F2 that indicate the parts, respectively and maintenance instructions D1 and D2 relating to the parts, respectively, that are the targets for the maintenance are displayed on imaged data of camera 12, in which the parts that are the target for the maintenance are included, in a manner that superimposes blow-off signs F1 and F2 and maintenance instructions D1 and D2, respectively, on each other. Thus, the person in charge of maintenance can easily acquire without erroneously determining a maintenance target part and maintenance instruction D therefor, and also without the need for an additional operation.

In FIG. 6, in electronic component mounting apparatuses M1 to M4, a specific marker P that in advance specifies a part that has the likelihood of being a maintenance target is affixed to such a part. In this example, specific marks P1 and P2 for specifying the parts that has the likelihood of be the target for the maintenance are affixed in the vicinity of tape feeder 23a and in the vicinity of tape feeder 23b, respectively, and a so-called marker method is illustrated in which blow-off signs F1 and F2 are displayed with these specific marks P1 and P2 guides. Blow-off signs F1 and F2 may be displayed without specific mark P being affixed using the so-call marker method. That is, pieces of location information on an end surface of the mounter and identification mark L1 are stored in advance, and are compared with a result of the recognition by camera 12 (recognition unit) and thus may determine display location of blow-off signs F1 and F2.

In FIG. 5, when performing the maintenance operation, camera 12 (recognition unit) recognizes electronic component mounters M1 to M4 in such a manner that specific marks P1 and P2 which specifies parts that are targets for maintenance fall within recognition range A (ST 27). In this state, record creator 14c creates pre-operation record N in which a pre-operation state of a maintenance target is recorded and in which recognized recognition data 15c (recognition information) is associated with maintenance instruction D, and stores created pre-operation record N, as pre-operation data 15f, in terminal storage 15, and transmits created pre-operation record N to management computer 3 (ST28). Transmitted pre-operation data 15f is stored, as pre-operation data 32e, in management storage 32. In this manner, recognized recognition data 15c (recognition information) is stored in management storage 32 (storage) in a state of being associated with maintenance instruction D.

A manager checks for pre-operation record N that is stored in management storage 32 in this manner, and thus can check whether or not electronic component mounting apparatuses M1 to M4 and parts that are targets for maintenance, on which the person in charge of maintenance performs the maintenance operation, are as those in maintenance instruction D, in management computer 3. Furthermore, after the maintenance operation, in the same manner as in ST27 and ST28, the part that is a maintenance target may be imaged and may be stored in management computer 3. By referring to this data, with management computer 3, the manager can check whether or not the maintenance operation can be performed as required by maintenance instruction D.

In portable terminal processing, all ST24 to ST 28, which are described above, does not need to be performed in this order. For example, processing order may be changed or displaying of some piece of information may be omitted. Furthermore, a record relating to production, such as a past maintenance record or a defective rate in the suction of an electronic component may be displayed on display screen 11a. By doing this, the person in charge of maintenance operation can obtain information necessary for the maintenance operation without performing an operation of searching database, in which these pieces of information are accumulated, for information, and thus can improve operation efficiency.

As described above, according to the present exemplary embodiment, electronic component mounting system 1 includes electronic component mounting line 1a which includes multiple electronic component mounting apparatuses M1 to M4 to which identification marks L1 to L4, respectively, are affixed, management computer 3 (management apparatus) that manages electronic component mounting line 1a, and portable terminal T that has display unit 11, camera 12 (recognition unit) that images and recognizes identification marks L1 to L4, and portable terminal side communication unit 13 that communicates with management computer 3.

In management computer 3, maintenance operation plan S is created for each of electronic component mounters M1 to M4, maintenance instruction D in which created maintenance operation plan S and identification marks L1 to L4 of electronic component mounters M1 to M4 are associated with each other are issued, issued maintenance instruction D and maintenance information I on electronic component mounters M1 to M4 that are associated with maintenance instruction D are stored, and issued maintenance instruction D is transmitted to portable terminal T.

In portable terminal T, transmitted maintenance instruction D is received, identification marks L1 to L4 that are affixed to electronic component mounters M1 to M4 are recognized by the recognition unit, and it is determined whether identification marks L1 to L4 that result from the recognition and identification marks L1 to L4 that are associated with received maintenance instruction D, respectively, are consistent with each other. In a case where it is determined that the two different sets of identification marks L1 to L4 are consistent with each other, maintenance information I on electronic component mounters M1 to M4 is displayed on display unit 11. Thus, in the maintenance operation by electronic component mounting system 1, efficiency in the operation by the person in charge of maintenance can be improved.

A maintenance support system and a maintenance support method in an electronic component mounting system according to the present invention have an effect that in maintenance of the electronic component mounting system, efficiency in an operation by a person in charge of maintenance, and are useful in a component mounting field in which a component is mounted onto a substrate.

What is claimed is:

1. A maintenance support system in an electronic component mounting system, the electronic component mounting system comprising:
   an electronic component mounting line that includes multiple electronic component mounters to which identification marks, respectively, are affixed;
   a management apparatus that manages the electronic component mounting line; and
   a portable terminal that has a display unit, a recognition unit that recognizes the identification marks, and a portable terminal side communication unit that communicates with the management apparatus,
   wherein the management apparatus includes
      an operation plan creator that creates a maintenance operation plan for each of the multiple electronic component mounters,
      an issuing unit that issues multiple maintenance instructions in which each of the maintenance operation plans that are created by the operation plan creator is associated with a different one of the identification marks of the multiple electronic component mounters,
      a storage in which the multiple maintenance instructions that are issued by the issuing unit and maintenance information that are associated with the multiple maintenance instructions on each of the multiple electronic component mounters, respectively, are stored, and
      a management apparatus side communication unit that communicates with the portable terminal,
   wherein the management apparatus transmits one of the multiple maintenance instructions that are issued by the issuing unit to the portable terminal, and transmits maintenance information that is associated with the transmitted one of the multiple maintenance instructions to the portable terminal, and wherein, when an identification mark affixed to any one of the multiple electronic component mounters that is recognized by the recognition unit is consistent with an identification mark that is associated with the received one of the multiple maintenance instructions, the portable terminal displays maintenance information on the electronic component mounter that corresponds to the two identification marks which are consistent with each other, among the multiple electronic component mounters, on the display unit.

2. The maintenance support system in an electronic component mounting system of claim 1,
wherein the portable terminal displays the recognition information that results from recognition by the recognition unit and the maintenance information on the electronic component mounter that corresponds to the two identification marks which are consistent with each other, among the multiple electronic component mounters, on the display unit, in a manner that superimposes the recognition information and the maintenance information on each other, when the identification mark recognized by the recognition unit is consistent with the identification mark that is associated with the received maintenance instruction.

3. The maintenance support system in an electronic component mounting system of claim 1,
wherein the portable terminal displays the recognition information that results from recognition by the recognition unit and location information on the electronic component mounter that corresponds to the two identification marks which are consistent with each other, among the multiple electronic component mounters, on the display unit, in a manner that superimposes the recognition information and the location information on each other, when the identification mark recognized by the recognition unit is consistent with the identification mark that is associated with the received maintenance instruction.

4. The maintenance support system in an electronic component mounting system of claim 1,
wherein the portable terminal displays recognition information that results from recognition by the recognition unit and information indicating a part that is a target for maintenance, on the display unit, in a manner that superimposes the recognition information and the information indicating the part onto each other, when the recognition unit recognizes one of the multiple electronic component mounters in such a manner that an identification mark that is affixed to the one of the multiple electronic component mounters and the part that is the target for the maintenance fall within a recognition range, and when the recognized identification mark is consistent with the identification mark that is associated with the received maintenance instruction.

5. The maintenance support system in an electronic component mounting system of claim 1,
wherein recognition information that results from recognition by the recognition unit in such a manner that a part of the multiple electronic component mounters, which needs maintenance, falls within a recognition range, is stored, as a maintenance request, in the storage, in a state of being associated with information on the electronic component mounter that has the part that needs the maintenance, which is specified by the identification mark that is affixed to the electronic component mounter that has the part which needs the maintenance, among the multiple electronic component mounters, and
wherein the operation plan creator creates the maintenance operation plan based on the maintenance request.

6. The maintenance support system in an electronic component mounting system of claim 1,
wherein a specific mark that specifies a part that is a target for maintenance is affixed to each of the multiple electronic component mounters, and
wherein, when performing a maintenance operation, recognition information that results from the recognition unit recognizing one of the multiple electronic component mounters in such a manner that the specific mark falls within a recognition range is stored in the storage in a state of being associated with the received maintenance instruction.

7. A maintenance support method in an electronic component mounting system, the electronic component mounting system including
an electronic component mounting line that includes multiple electronic component mounters to which identification marks, respectively, are affixed;
a management apparatus that manages the electronic component mounting line; and
a portable terminal that has a display unit, a recognition unit that recognizes the identification marks, and a portable terminal side communication unit that communicates with the management apparatus,
wherein the management apparatus includes a management apparatus side communication that communicates with the portable terminal,
the maintenance support method comprising:
a step of creating a maintenance operation plan for each of the multiple electronic component mounters;
a step of issuing multiple maintenance instructions in which each of the maintenance operation plans that are created is associated with a different one of the identification marks of the multiple electronic component mounters;
a step of storing the multiple maintenance instructions that are issued and maintenance information on each of the multiple electronic component mounters that are associated with the multiple maintenance instructions, respectively, in a storage; and
a step of transmitting one of the multiple maintenance instructions that are issued, to the portable terminal, and transmitting maintenance information that is associated with the transmitted one of the multiple maintenance instructions, to the portable terminal;
a step of causing the portable terminal to receive the transmitted maintenance instruction;
a step of causing the recognition unit to acquire recognition information that includes an identification mark that is affixed to any one of the multiple electronic component mounters, through recognition; and
a step of determining whether or not the identification mark that results from the recognition and an identification mark that is associated with the received maintenance instruction are consistent with other,
wherein, in a case where it is determined that the recognized identification mark and the identification mark that is associated with the received maintenance instruction are consistent with each other, the maintenance information on the electronic component mounter that corresponds to the two identification marks which are consistent with each other, among the multiple electronic component mounters, is displayed on the display unit.

8. The maintenance support method in an electronic component mounting system of claim 7,
wherein the recognition information that results from recognition by the recognition unit and the maintenance information on the electronic component mounter that corresponds to the two identification marks which are consistent with each other, among the multiple electronic component mounters, are displayed on the display unit, in a manner that superimposes the recognition information and the maintenance information on each other, in a case where it is determined that the recognized identification mark and the identification mark that is associated with the received maintenance instruction are consistent with each other.

9. The maintenance support method in an electronic component mounting system of claim 7,
wherein the recognition information that results from recognition by the recognition unit and location information on the electronic component mounter that corresponds to the two identification marks which are consistent with each other, among the multiple electronic component mounters, are displayed on the display unit, in a manner that superimposes the recognition information and the location information on each other, in a case where it is determined that the recognized identification mark and the identification mark that is associated with the received maintenance instruction are consistent with each other.

10. The maintenance support method in an electronic component mounting system of claim 7,
wherein the recognition unit recognizes any one of the multiple electronic components mounters in such a manner that an identification mark that is affixed to any one of the multiple electronic component mounters and the part that is the target for maintenance fall within a recognition range, and
wherein, in a case where it is determined that the recognized identification mark and the identification mark that is associated with the received maintenance instruction are consistent with each other, the recognition information recognized by the recognition unit and information indicating the part that is the target for the maintenance are displayed on the display unit, in a manner that superimposes the recognition information and the information indicating the part on each other.

11. The maintenance support method in an electronic component mounting system of claim 7, further comprising:
a step of causing the recognition unit to recognize a part of the multiple electronic component mounters, which needs maintenance, in such a manner that the part falls within a recognition range; and
a step of storing the recognition information that results from the recognition, as a maintenance request, in the storage, in a state of being associated with information on the electronic component mounter that has the part that needs the maintenance, which is specified by the identification mark that is affixed to the electronic component mounter that has the part which needs the maintenance, among the multiple electronic component mounters,
wherein, in the step of creating a maintenance operation plan, the maintenance operation plan is created based on the maintenance request.

12. The maintenance support method in an electronic component mounting system of claim 7,
wherein the specific mark that specifies a part that is a target for maintenance is affixed to each of the multiple electronic component mounters,
the method further comprising:
a step of causing the recognition unit to recognize any one of the multiple electronic component mounters in such a manner that a specific mark falls within a recognition range, when performing a maintenance operation; and
a step of storing the recognition information that results from the recognition in the storage in a state of being associated with the received maintenance instruction.

\* \* \* \* \*